US011837531B2

(12) United States Patent
Schaller

(10) Patent No.: US 11,837,531 B2
(45) Date of Patent: *Dec. 5, 2023

(54) SEMICONDUCTOR DEVICE WITH GALVANICALLY ISOLATED SEMICONDUCTOR CHIPS

(71) Applicant: Infineon Technologies AG, Neubiberg (DE)

(72) Inventor: Rainer Markus Schaller, Saal An der Donau (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,750

(22) Filed: Aug. 9, 2022

(65) Prior Publication Data

US 2022/0384319 A1 Dec. 1, 2022

Related U.S. Application Data

(63) Continuation of application No. 16/907,739, filed on Jun. 22, 2020, now Pat. No. 11,444,007.

(30) Foreign Application Priority Data

Jul. 2, 2019 (DE) .......................... 102019117789.8

(51) Int. Cl.
*H01L 23/495* (2006.01)
*H01L 25/065* (2023.01)
(Continued)

(52) U.S. Cl.
CPC ........ *H01L 23/49541* (2013.01); *H01L 23/14* (2013.01); *H01L 23/31* (2013.01);
(Continued)

(58) Field of Classification Search
CPC ......... H01L 23/00; H01L 23/14; H01L 23/16; H01L 23/31; H01L 23/495;
(Continued)

(56) References Cited

U.S. PATENT DOCUMENTS 10,756,054 B1 * 8/2020 Huang .................. H01L 21/568
11,444,007 B2 * 9/2022 Schaller ............ H01L 23/49537
(Continued)

FOREIGN PATENT DOCUMENTS

| DE | 102008025451 A1 | 12/2008 |
| DE | 102016111573 A1 | 12/2016 |
| DE | 102017120763 A1 | 3/2018 |

*Primary Examiner* — Chuong A Luu
(74) *Attorney, Agent, or Firm* — Harrity & Harrity, LLP

(57) ABSTRACT

A semiconductor device includes a chip carrier, a first semiconductor chip arranged on the chip carrier, the first semiconductor chip being located in a first electrical potential domain when the semiconductor device is operated, a second semiconductor chip arranged on the chip carrier, the second semiconductor chip being located in a second electrical potential domain different from the first electrical potential domain when the semiconductor device is operated, and an electrically insulating structure arranged between the first semiconductor chip and the second semiconductor chip, which is designed to galvanically isolate the first semiconductor chip and the second semiconductor chip from each other.

27 Claims, 4 Drawing Sheets

(51) Int. Cl.
 *H01L 23/31* (2006.01)
 *H01L 23/14* (2006.01)
 *H01L 23/00* (2006.01)

(52) U.S. Cl.
 CPC ...... *H01L 23/3107* (2013.01); *H01L 23/4951* (2013.01); *H01L 23/49506* (2013.01); *H01L 23/49537* (2013.01); *H01L 23/49575* (2013.01); *H01L 24/32* (2013.01); *H01L 24/40* (2013.01); *H01L 24/48* (2013.01); *H01L 25/0657* (2013.01); *H01L 2224/32245* (2013.01); *H01L 2224/40175* (2013.01); *H01L 2224/48247* (2013.01)

(58) Field of Classification Search
 CPC ............. H01L 23/3107; H01L 23/4951; H01L 23/49513; H01L 23/49557; H01L 23/49506; H01L 23/49537; H01L 23/49541; H01L 23/498; H01L 23/49503; H01L 23/49572; H01L 23/49568; H01L 23/49575; H01L 23/49579; H01L 24/32; H01L 24/40; H01L 24/48; H01L 25/16; H01L 25/065; H01L 25/0657; H01L 2224/24135; H01L 2224/40135; H01L 2224/48135; H01L 2224/2612; H01L 2224/32245; H01L 2224/40175; H01L 2224/48247; H01L 2224/32145; H01L 2224/48091; H01L 2224/48257; H01L 2224/73265; H01L 2224/48465; H01L 2924/181; H01L 2924/00014
 USPC ...................................................... 257/676
 See application file for complete search history.

(56) References Cited

U.S. PATENT DOCUMENTS

| | | |
|---|---|---|
| 2004/0201088 A1 | 10/2004 | Kim et al. |
| 2005/0006746 A1 | 1/2005 | Egawa |
| 2008/0296782 A1 | 12/2008 | Otremba et al. |
| 2013/0256857 A1 | 10/2013 | Gruber et al. |
| 2017/0069558 A1 | 3/2017 | Bang et al. |
| 2018/0076154 A1 | 3/2018 | Bernardinis |

* cited by examiner

SEMICONDUCTOR DEVICE WITH GALVANICALLY ISOLATED SEMICONDUCTOR CHIPS

CROSS-REFERENCE TO RELATED APPLICATIONS

This application is a continuation of U.S. patent application Ser. No. 16/907,739 filed on Jun. 22, 2020, which claims the benefit of German Patent Application No. 102019117789.8 filed on Jul. 2, 2019, which are incorporated by reference as if fully set forth.

FIELD

The present disclosure relates, in general, to semiconductor technology. In particular, the disclosure relates to semiconductor devices with galvanically isolated semiconductor chips.

BACKGROUND

Semiconductor devices may contain multiple semiconductor chips. Thus, for safety reasons sensor applications may have multiple redundant sensor chips, for example. During operation of the devices, potential differences between the semiconductor chips can occur. On the one hand, such potential differences can be static in nature and can exist over an extended period of time. On the other hand, the potential differences can occur in the form of voltage peaks. A lack of or insufficient insulation between the semiconductor chips can cause damage to the chips. Manufacturers of semiconductor devices are constantly striving to improve their products. In particular, it may be desirable to provide reliable and safe operation of the semiconductor devices.

SUMMARY

Various aspects relate to a semiconductor device including a chip carrier, a first semiconductor chip arranged on the chip carrier, the first semiconductor chip being located in a first electrical potential domain when the semiconductor device is operated, a second semiconductor chip arranged on the chip carrier, the second semiconductor chip being located in a second electrical potential domain different from the first electrical potential domain when the semiconductor device is operated, and an electrically insulating structure arranged between the first semiconductor chip and the second semiconductor chip, which is designed to galvanically isolate the first semiconductor chip and the second semiconductor chip from each other.

BRIEF DESCRIPTION OF THE DRAWINGS

Semiconductor devices in accordance with the disclosure are described in more detail in the following with the aid of drawings. The elements shown in the drawings are not necessarily reproduced true to scale relative to each other. Identical reference signs can refer to identical components.

DETAILED DESCRIPTION

Figure 1:
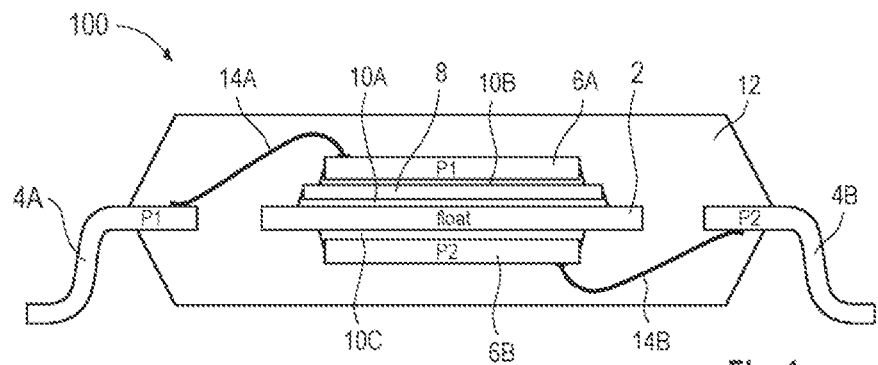
FIG. 1 shows a schematic, cross-sectional side view of a semiconductor device 100 as described in the disclosure.

FIG. 1 shows a schematic, cross-sectional side view of a semiconductor device 100 as described in the disclosure. The semiconductor device 100 is shown in a general form, in order to qualitatively describe aspects of the disclosure. The semiconductor device 100 can comprise further aspects, which are not shown in FIG. 1 for the sake of simplicity. For example, the semiconductor device 100 may be extended to include any aspects described in connection with other semiconductor devices as described in the disclosure. The statements regarding FIG. 1 may apply equally to other semiconductor devices described herein.

The semiconductor device 100 can have a chip carrier 2 and a plurality of connecting leads 4A, 4B. For example, the chip carrier 2 can be a diepad of a lead frame and the connecting leads 4A, 4B can be leads of the lead frame. The chip carrier 2 and the connecting leads 4A, 4B can be made of a conductive material, for example a metal, such as copper, nickel, aluminum, or stainless steel. A first semiconductor chip 6A or a second semiconductor chip 6B can be arranged above the upper and lower side of the chip carrier 2. In addition, between the chip carrier 2 chip and the first semiconductor chip 6A an electrically insulating structure 8 can be arranged, which can be designed to galvanically isolate the first semiconductor chip 6A and the second semiconductor chip 6B from each other. The electrically insulating structure 8 can increase the voltage breakdown strength in the vertical direction. The first semiconductor chip 6A and the second semiconductor chip 6B can be electrically connected to the connecting leads 4A or 4B via connecting elements 14A or 14B. In the example of FIG. 1, the connecting elements 14A, 14B can be bond wires. In other examples, the connecting elements 14A, 14B can be in the form of clips and/or strips.

Components of the semiconductor device 100 can be mechanically interconnected by means of a fixing material. The electrically insulating structure 8 can be fixed to the top of the chip carrier 2 by means of a first fixing material 10A and the first semiconductor chip 6A can be fixed to the top of the electrically insulating structure 8 by means of a second fixing material 10B. Similarly, the second semiconductor chip 6B can be fixed to the underside of the chip carrier 2 by means of a third fixing material 10C. The fixing materials 10A to 10C can consist of the same material or different materials and can be electrically conductive or electrically insulating, depending on the application. In one example, one or more of the fixing materials 10A to 10C can be an electrically insulating adhesive. By the addition of filler particles, such an adhesive can be provided with a desired electrical conductivity. In another example, one or more of the fixing materials 10A to 10C can be a D-DAF (Dicing Die Attach Film).

The components of the semiconductor device 100 may be at least partially encapsulated by an encapsulation material 12. In this case, in particular, the connecting leads 4A, 4B can protrude from the encapsulation material 12 in order to enable electrical contacting of the semiconductor chips 6A, 6B from outside of the semiconductor device 100. The housing or package formed by the encapsulation material 12 can be a so-called PG-TDSO housing, for example.

During operation of the semiconductor device 100, the first semiconductor chip 6A and the second semiconductor chip 6B can be located in a first potential domain (see "P1") or in a second potential domain (see "P2"), which is different from the first potential domain. In one example, this may mean that the first semiconductor chip 6A is operated at a first operating voltage (or in a first operating voltage range), while the second semiconductor chip 6B is operated at a second operating voltage (or in a second operating voltage range) different from the first operating voltage. In other words, the first electrical potential domain can correspond to a first operating voltage of the first semiconductor chip 6A, and the second electrical potential domain can correspond to a second operating voltage of the second semiconductor chip 6B different from the first.

In a specific case, the first semiconductor chip 6A can be a power semiconductor chip that can be operated in a high voltage range of maximum voltages up to approximately 1500V, while the second semiconductor chip 6B can be a chip with a logic circuit (e.g. an ASIC chip) that can be operated in a low-voltage range of approximately 5V or approximately 7.5V. The operation of the semiconductor chips 6A, 6B in different potential domains can result in potential differences between the semiconductor chips 6A, 6B. Similarly, potential differences between the semiconductor chips 6A, 6B can arise when the semiconductor chips 6A, 6B are operated in different current ranges, for example in a low-current and a high-current range.

In another example, at least one of the semiconductor chips 6A, 6B can be connected to a ground potential. In particular, the first semiconductor chip 6A can be connected to a first ground potential and the second semiconductor chip 6B to a second ground potential, different from the first ground potential. In other words, the first electrical potential domain can correspond to a first ground potential of the first semiconductor chip 6A, and the second electrical potential domain can correspond to a second ground potential of the second semiconductor chip 6B different from the first. In a specific case, the semiconductor chips 6A, 6B can belong to different circuit modules which are at different ground potentials. The different ground potentials can likewise give rise to potential differences between the semiconductor chips 6A, 6B.

The potential differences resulting from the different potential domains can, on the one hand, be static in nature and persist over an extended period of time. On the other hand, the potential differences can occur in the form of voltage peaks. In automotive applications, static potential differences can assume a typical value of approximately 48V, for example. For example, higher impulse voltages can occur repeatedly during vehicle start-up, during vehicle maintenance, or even during an accident. This can lead to voltage peaks of around 100V over a period of around 1 ms, or to voltage peaks of around 300V over a period of around 1 µs.

In the example of FIG. 1, the first semiconductor chip 6A and the first connecting lead 4A can be at an equal electrical potential (see "P1"), due to their electrical connection via the first connecting element 14A. The same applies to the second semiconductor chip 6B and the second connecting lead 4B (see "P2"), which are electrically connected to each other via the second connecting element 14B. The chip carrier 2 can be at a different electrical potential from both the first potential P1 and the second potential P2 (see "float"), which can be between potentials P1 and P2, in particular.

The electrically insulating structure 8 of FIG. 1 may have one or more of the physical properties described below. The same may apply to other electrically insulating structures according to the disclosure described herein. The physical properties can remain essentially constant over a period of more than approximately 15 years, thus providing reliable operation of the semiconductor device 100. The breakdown voltage of the electrically insulating structure 8 can be in a range of approximately 10 V/µm to approximately 200 V/µm. A typical value for the breakdown voltage can be approximately 40 V/µm. The electrically insulating structure 8 can have a dielectric constant εr in a range from about 3 to about 10. A typical value for the dielectric constant εr of the electrically insulating structure 8 can be approximately 4. A defect density of the electrically insulating structure 8 can be less than approximately $0.1/mm^2$.

The electrically insulating structure 8 can be free of alkaline earth elements. Alkaline earth components can include a basic ionic salt of a chemical element of an alkaline earth metal (for example, magnesium). Dissolved components of such salts can cause degradation of semiconductor devices as catalysis products. By using the alkaline-earth free structure 8, such degradation of semiconductor device 100 can be reduced.

The electrically insulating structure 8 can be free of plasticizers and/or solvents. The material of the electrically insulating structure 8 can therefore differ from the type of materials which can be used for fixing semiconductor chips onto chip carriers, for example (so-called "die-attach materials"). Such fixing materials may contain plasticizers and/or solvents that may become volatile over time. This may cause the physical properties of the fixing material to change in undesirable ways. In contrast, the electrically insulating structure 8 can have physical properties that are constant over a long period of time and contribute to a reliable operation of the semiconductor device 100.

In one example, the electrically insulating structure 8 can be essentially non-adhesive. This can mean, in particular, that the electrically insulating structure 8 can be unsuitable, for example, for fixing the first semiconductor chip 6A to the chip carrier 2. A sufficient degree of fixing of the semiconductor chip 6A to the chip carrier 2 may be necessary, in particular, in order to be able to properly encapsulate the device components using the encapsulation material 12. Accordingly, an additional use of the fixing materials 10A, 10B may be necessary to fix the first semiconductor chip 6A to the chip carrier 2. The material of the electrically insulating structure 8 can therefore differ from the fixing materials 10A, 10B in respect of its adhesion properties.

The electrically insulating structure 8 can be shaped in such a way that it completely separates the first fixing material 10A from the second fixing material 10B. In other words, the electrically insulating structure 8 can prevent mechanical contact between the two fixing materials 10A, 10B. The shape or design of the electrically insulating structure 8 can therefore depend on the shape of the fixing materials 10A, 10B. For example, the electrically insulating structure 8 can have a rectangular, round or oval shape when viewed from above.

The electrically insulating structure 8 can have a dielectric, which is designed, in particular, in the form of a dielectric die. A thickness of the dielectric or dielectric die can vary depending on the degree of desired galvanic isolation between the semiconductor chips 6A, 6B and can be in a range from approximately 30 µm to approximately 200 µm or from approximately 30 µm to approximately 100 µm or from approximately 100 µm to approximately 200 µm or from approximately 75 µm to approximately 145 µm. In general, the electrically insulating structure 8 can be made of or comprise both organic as well as inorganic materials. For example, the dielectric may contain one of the following materials: ceramic, glass, Kapton.

In the case of a semiconductor device without an electrically insulating structure 8, only the fixing material can be located between the first semiconductor chip 6A and the chip carrier 2. For example, the fixing material can be an electrically insulating polymer-based adhesive. Such a material can incur material fractures over time. In addition, ion migration of metal particles of the chip carrier 2 (e.g. silver, copper) can occur in and through the fixing material. Due to such material degradation, in the event of a potential difference between the first semiconductor chip 6A and the second semiconductor chip 6B (see "P1" and "P2"), the probability of a voltage flashover between the semiconductor chips 6A, 6B may be increased. This can result in damage to and failure of the semiconductor device 100 and of the system in which the semiconductor device 100 is integrated (e.g. an electric motor). By contrast, the use of the electrically insulating structure 8, due to the constant physical properties over a long period of time as discussed above, can guarantee reliable operation of the semiconductor device 100 and prevent failure of the entire system.

FIGS. 2 to 12 show schematic cross-sectional side views of semiconductor devices 200 to 1200 according to the disclosure. The semiconductor devices 200 to 1200 can be at least partially similar to the semiconductor device 100 of FIG. 1, so that statements in relation to FIG. 1 can also apply to FIGS. 2 to 12.

Figure 2:
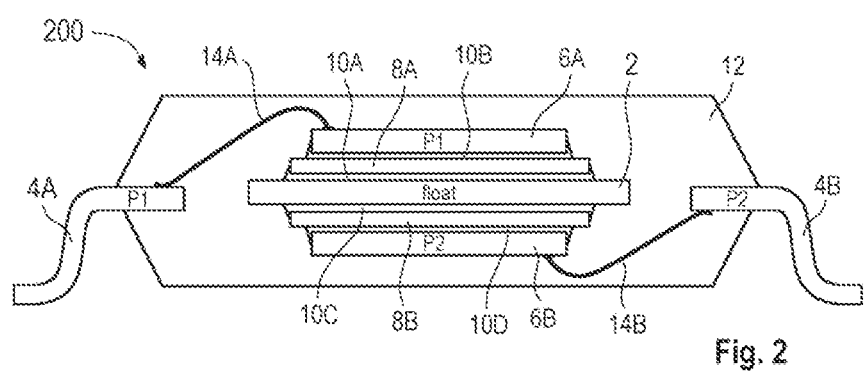
FIG. 2 shows a schematic, cross-sectional side view of a semiconductor device 200 as described in the disclosure.

In comparison to FIG. 1, the semiconductor device 200 of FIG. 2 can also have a second electrically insulating structure 8B, in addition to a first electrically insulating structure 8A described above. The second electrically insulating structure 8B can be arranged between the underside of the chip carrier 2 and the second semiconductor chip 6B. In this case the second electrically insulating structure 8B can be fixed to the underside of the chip carrier 2 by means of a fixing material 10C, and the second semiconductor chip 6B can be fixed to the underside of the second electrically insulating structure 8B by means of a further fixing material 10D. By using the second electrically insulating structure 8B, on the one hand, a galvanic isolation can be provided between the second semiconductor chip 6B and the chip carrier 2. On the other hand, a galvanic isolation between the semiconductor chips 6A and 6B can be reinforced.

A thickness of the first electrically insulating structure 8A in the vertical direction can depend on the potential difference between the first semiconductor chip 6A (see "P1") and the chip carrier 2 (see "float"). In a similar way, a thickness of the second electrically insulating structure 8B in the vertical direction can depend on the potential difference between the second semiconductor chip 6B (see "P2") and the chip carrier 2 (see "float"). Accordingly, a dimension of the second electrically insulating structure 8B can be identical to or different from a dimension of the first electrically insulating structure 8A.

Figure 3:
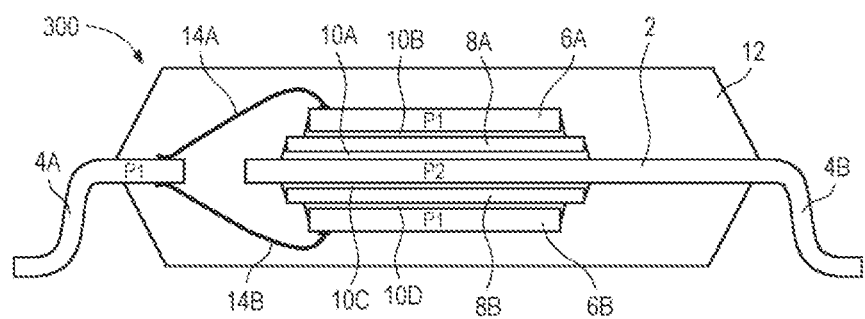
FIG. 3 shows a schematic, cross-sectional side view of a semiconductor device 300 as described in the disclosure.

In the example of the semiconductor device 300 of FIG. 3, the chip carrier 2 can be electrically connected to the second connecting lead 4B or constructed integrally therewith. As a result, the second connecting lead 4B and the chip carrier 2 can be at an equal electrical potential (see "P2"). For example, the semiconductor device 300 can be a current sensor with two sensor chips and a current-carrying measuring conductor (i.e. with a power rail), integrated into the housing or the encapsulation material 12. Each of the semiconductor chips 6A, 6B can comprise a sensor chip, and the chip carrier 2 can provide the functionality of the power rail. In one example, the sensor chips can be redundant sensor chips that can be based on the same sensor technology. In another example, the sensor chips can be based on different sensor technologies and thus provide diversity in the sensor measurement. During the operation of such an arrangement, each of the sensor chips 6A, 6B can be set at an electrical potential P1 in a range from around 0 V to around 5 V and the power rail can be set at an electrical potential P2 in a range from around 0 V to around 1700 V. As a result, large potential differences can occur between the chip carrier 2 and the first semiconductor chip 6A, as well as between the chip carrier 2 and the second semiconductor chip 6B. Due to galvanic isolation between these components by means of the electrically insulating structures 8A, 8B, any voltage flashovers caused by the potential differences can be prevented.

Figure 4:
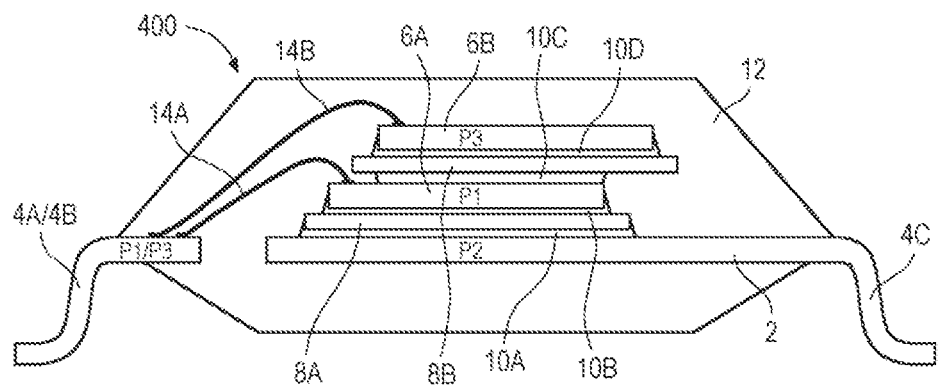
FIG. 4 shows a schematic, cross-sectional side view of a semiconductor device 400 as described in the disclosure.

In contrast to the preceding examples, in the semiconductor device 400 of FIG. 4 the first semiconductor chip 6A and the second semiconductor chip 6B can be arranged on the same surface of the chip carrier 2. In the example of FIG. 4, the semiconductor chips 6A and 6B can also be stacked on top of each other. The semiconductor device 400 can have a first electrically insulating structure 8A, which can be arranged between the top of the chip carrier 2 and the underside of the first semiconductor chip 6A. In addition, a second electrically insulating structure 8B can be arranged between the top of the first semiconductor chip 6A and the underside of the second semiconductor chip 6B. The semiconductor chips 6A, 6B and the electrically insulating structures 8A, 8B can be fixed to each other by means of fixing materials 10A to 10D.

The first semiconductor chip 6A and a first connecting lead 4A can be electrically connected to each other via a first connecting element 14A and can be set at an equal electrical potential P1. In a similar way the second semiconductor chip 6B and a second connecting lead 4B can be electrically connected to each other via a second connecting element 14B and can be set at an equal electrical potential P3. In the side view of FIG. 4, the second connecting lead 4B can be arranged behind the first connecting lead 4A and be concealed by the latter, or vice versa. In addition, the chip carrier 2 and a third connecting lead 4C can be electrically connected to each other or integrally constructed, and can be set at an equal electrical potential P2. The electrical potentials P1, P2 and P3 can be different from each other in each case, which means that potential differences can arise between the individual components of the semiconductor device 400. The first electrically insulating structure 8A can be designed to galvanically isolate the chip carrier 2 and the first semiconductor chip 6A. In addition, the second electrically insulating structure 8B can be designed to galvanically isolate the two semiconductor chips 6A, 6B from each other.

Figure 5:
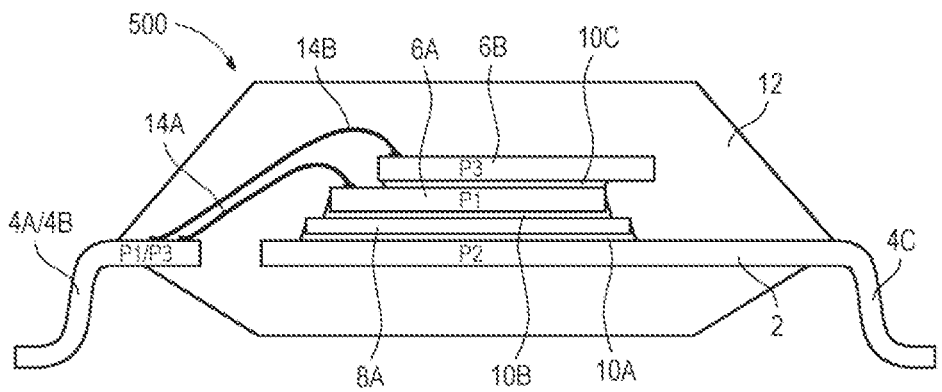
FIG. 5 shows a schematic, cross-sectional side view of a semiconductor device 500 as described in the disclosure.

In comparison to FIG. 4, the semiconductor device 500 of FIG. 5 cannot have an electrically insulating structure arranged between the semiconductor chips 6A, 6B. For example, the difference between the electrical potentials P1 and P3 can have a relatively small value, so that galvanic isolation between the semiconductor chips 6A, 6B using an electrically insulating structure according to the disclosure is not necessary. In such a case, sufficient galvanic isolation between the semiconductor chips 6A and 6B can already be provided by an electrically insulating fixing material 10C.

Figure 6:
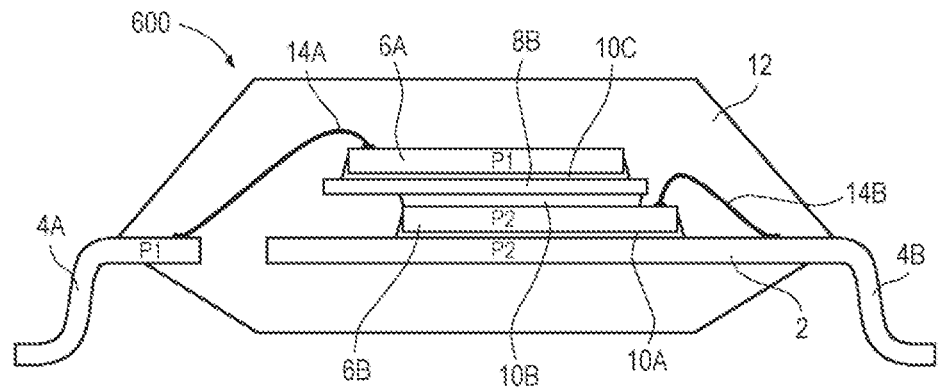
FIG. 6 shows a schematic, cross-sectional side view of a semiconductor device 600 as described in the disclosure.

In comparison to FIG. 4, the semiconductor device 600 of FIG. 6 cannot have an electrically insulating structure arranged between the chip carrier 2 and the lower semiconductor chip 6B. In the example of FIG. 6, the chip carrier 2 and the lower semiconductor chip 6B can be set at an equal electrical potential P2, so that galvanic isolation using an electrically insulating structure according to the disclosure may not be necessary. The upper semiconductor chip 6A and the left-hand connecting lead 4A can be at an equal electrical potential P1, which may be different from the electrical potential P2. Galvanic isolation between the semiconductor chips 6A, 6B can be provided by the electrically insulating structure 8B.

Figure 7:
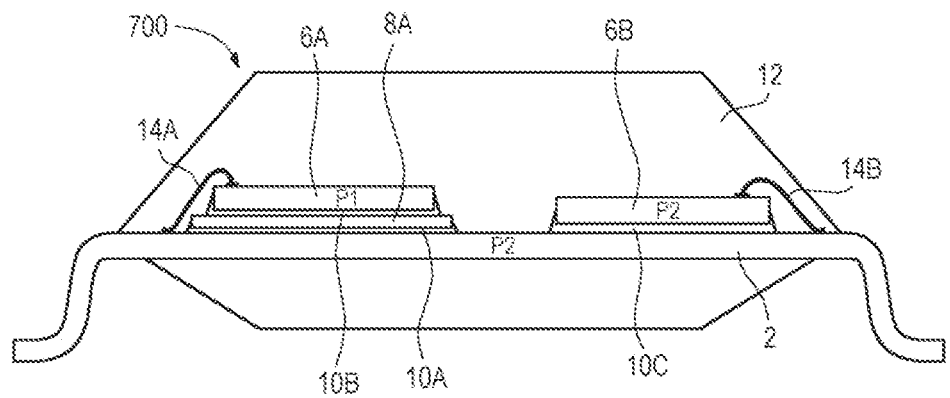
FIG. 7 shows a schematic, cross-sectional side view of a semiconductor device 700 as described in the disclosure.

In the semiconductor device 700 of FIG. 7, the semiconductor chips 6A, 6B can be arranged side by side on an identical surface of the chip carrier 2. The first semiconductor chip 6A and chip carrier 2 can be set at different electrical potentials P1 or P2 and be galvanically isolated from each other by an electrically insulating structure 8A. The first semiconductor chip 6A can be electrically connected to a connecting lead via a first connecting element 14A, which may be concealed in the side view of FIG. 7. The second semiconductor chip 6B and the chip carrier 2 can be at the same electrical potential P2 and be electrically connected to each other via a second connecting element 14B, so that galvanic isolation of these components by an electrically insulating layer according to the disclosure may not be necessary.

Figure 8:
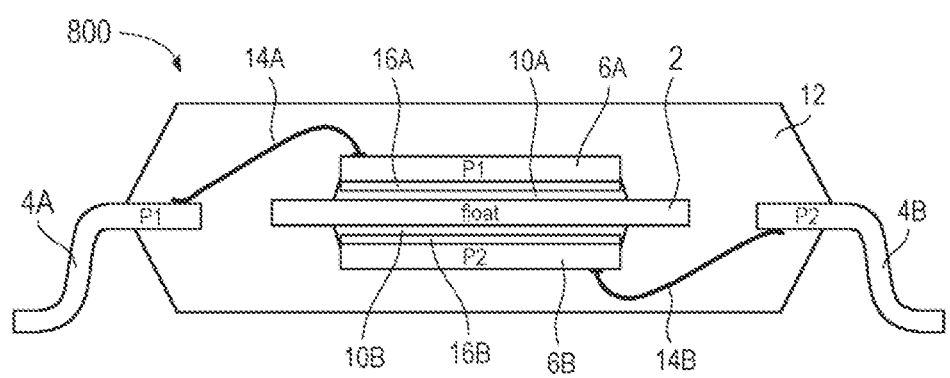
FIG. 8 shows a schematic, cross-sectional side view of a semiconductor device 800 as described in the disclosure.

The semiconductor device 800 of FIG. 8 can be similar to the semiconductor device 200 of FIG. 2. In contrast to FIG. 2, the electrically insulating structures of the semiconductor device 800 can be implemented as surface coatings 16A, 16B of the semiconductor chips 6A, 6B. In particular, the respective surface coating can be arranged on the reverse of the respective semiconductor chip. The reverse of a semiconductor chip can be located opposite to an active side of the semiconductor chip. The electronic structures of the semiconductor chip can be integrated into an active side of a semiconductor chip. In addition, an active side of a semiconductor chip can have electrical contacts of the semiconductor chip. The surface coatings 16A, 16B can be, for example, passivation layers of the semiconductor chips 6A, 6B.

The surface coatings 16A, 16B can be produced at the wafer level, for which any wafer back-side coating process may be used. For example, in this context at least one of a printing process, a spray coating process or a spin coating process can be used. The surface coatings 16A, 16B of the semiconductor chips 6A, 6B can comprise at least one of the following materials: silicon oxide, silicon nitride, metal oxide, polymer, polyimide. The silicon oxide can be SiO2, for example. The ceramic material can be, in particular, aluminum oxide and/or copper oxide. The respective thickness of the surface coatings 16A, 16B can be in a range from around 2 µm to around 10 µm. A typical example value of a thickness of the surface coatings 16A, 16B can be around 5 µm.

Figure 9:
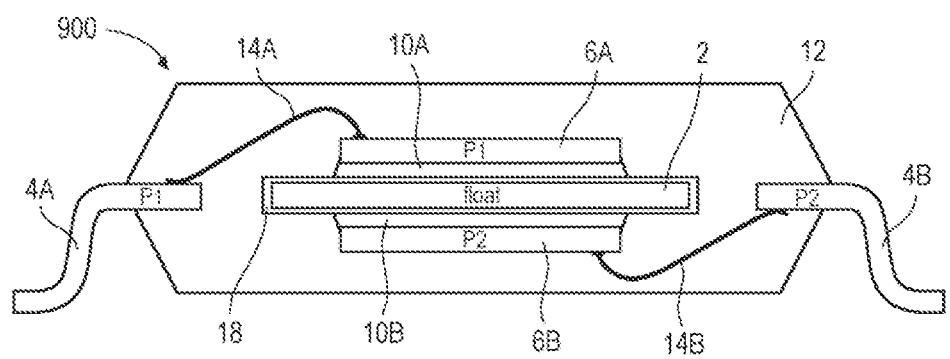
FIG. 9 shows a schematic, cross-sectional side view of a semiconductor device 900 as described in the disclosure.

The semiconductor device 900 of FIG. 9 can be similar to the semiconductor device 200 of FIG. 2. In contrast to FIG. 2, the electrically insulating structures of the semiconductor device 900 can be implemented as one or more surface coatings 18 of the chip carrier 2. In the example of FIG. 9, the entire surface of the chip carrier 2 can be covered by the surface coating 18. In other examples, the material of the surface coating 18 may cover only selected surface sections of the chip carrier 2. For example, the material can be arranged on only the upper or the lower side of the chip carrier 2. The specific distribution of the material can depend, in particular, on the electrical potential distribution of the device components. In the example of FIG. 9, only one surface coating 18 is shown. In other examples, any number of multiple surface coatings 18 can be arranged on the chip carrier 2. The surface coatings 18 can be arranged on top of each other and/or next to each other.

The surface coating 18 can be produced by any suitable method. In one example, the material of the surface coating 18 can be deposited electrophoretically. The surface coating 18 of the chip carrier 2 can comprise at least one of the following materials: parylene, metal oxide. The ceramic material can be, in particular, aluminum oxide and/or copper oxide. The thickness of the surface coating 18 can lie in a range from around 2 µm to around 10 µm.

Figure 10:
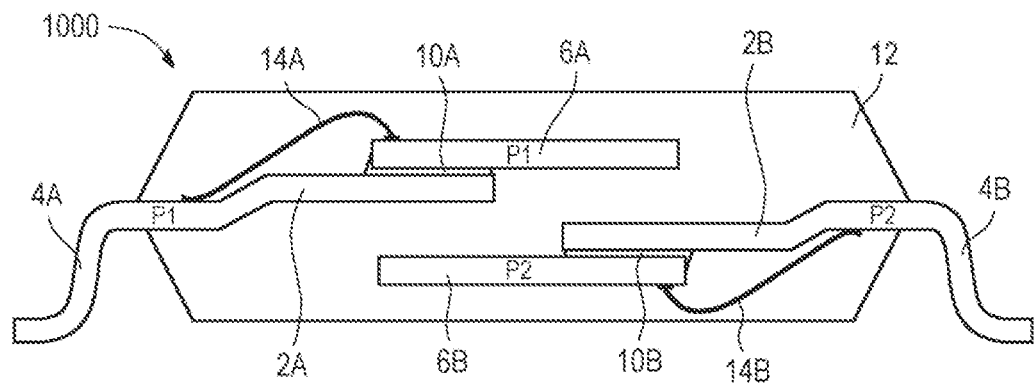
FIG. 10 shows a schematic, cross-sectional side view of a semiconductor device 1000 as described in the disclosure.

In the semiconductor device 1000 of FIG. 10, an electrically insulating structure for the galvanic isolation of the semiconductor chips 6A, 6B can be formed by the encapsulation material 12. The chip carrier 2 in this case can be designed or shaped in such a way that the encapsulation material 12 is arranged between the first semiconductor chip 6A and the second semiconductor chip 6B. For this purpose, the chip carrier can have two parts 2A, 2B, for example, which may be offset relative to each other in the vertical direction. The first semiconductor chip 6A can then be arranged on the first part 2A and the second semiconductor chip 6B on the second part 2B.

For example, the parts 2A, 2B of the chip carrier may be bent in any suitable manner, so that the encapsulation material 12 is arranged between the semiconductor chips 6A, 6B, thus providing a galvanic isolation between the semiconductor chips 6A, 6B. In the example of FIG. 10, the first part 2A of the chip carrier is bent upwards and the second part 2B of the chip carrier is bent downwards. The parts 2A, 2B of the chip carrier with the respectively connected connecting lead 4A, 4B can each form a step shape. In other examples, only one of the two parts 2A, 2B may be bent. In yet another example, the parts 2A, 2B can be arranged vertically offset relative to each other without being bent.

The chip carrier consisting of the two parts 2A, 2B can be formed from a single lead frame, for example. Alternatively, the chip carrier can be formed by joining together (e.g. welding together) two "half" lead frames. In this case the two half lead frames can have an identical geometric shape and be rotated 180 degrees to each other when they are joined.

The semiconductor chips 6A, 6B of the semiconductor device 1000 can form a coupler, for example. The coupler can be a magnetic coupler, an optocoupler or a microwave coupler. The first semiconductor chip 6A can be designed to transmit appropriate signals, and the second semiconductor chip 6B can be designed to receive the signals transmitted. For example, in the case of an optocoupler, the first semiconductor chip 6A can have a light-emitting component and the second semiconductor chip 6B can have a light-sensitive receiver. It should be noted that a suitable material should be provided for the transmission of the corresponding signals between the semiconductor chips 6A, 6B. For example, in an optocoupler, a transparent Kapton film and/or an optical gel can be arranged between the semiconductor chips 6A, 6B.

Figure 11:
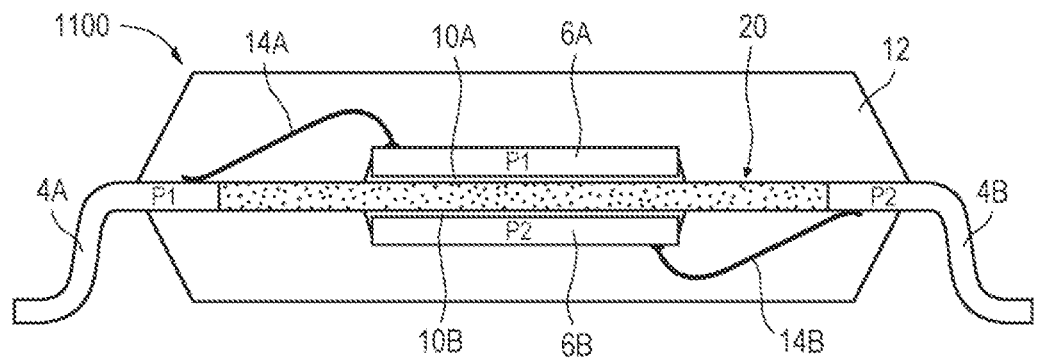
FIG. 11 shows a schematic, cross-sectional side view of a semiconductor device 1100 as described in the disclosure.
Figure 12:
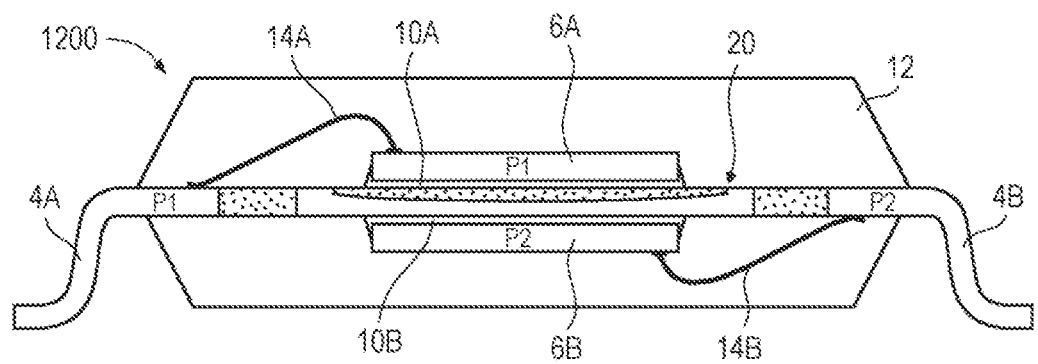
FIG. 12 shows a schematic, cross-sectional side view of a semiconductor device 1200 as described in the disclosure.

In the examples of FIGS. 11 and 12, an electrically insulating structure according to the disclosure can be part of a routable molded lead frame (Rt-MLF) 20. For example, an Rt-MLF can have one or more horizontally oriented electrically insulating laminated layers and electrically conductive via-connections running through the laminated layers in a vertical direction. In FIGS. 11 and 12, electrically insulating parts of the Rt-MLF 20 are represented by dotted areas. In the example of FIG. 11, a central region of the Rt-MLF 20 can be free of electrically conducting structures (for example, via-connections) and provide galvanic isolation between the semiconductor chips 6A, 6B.

In the example of FIG. 12, the Rt-MLF 20 can have one central and two outer electrically insulating regions. For example, the central region can be produced by etching the Rt-MLF 20 on its upper side and filling the etched recess with an electrically insulating material. The upper side of the RT-MLF 20 and the electrically insulating filling material can lie in a common plane, i.e. be aligned flush. The electrically insulating filling material can be designed to provide galvanic isolation between the semiconductor chips 6A, 6B.

It should be noted that the examples described above can be combined as desired. In particular, an electrically insulating structure according to the disclosure may contain or be composed of a plurality of the exemplary embodiments described above. For example, the electrically insulating structure can comprise both a dielectric die (see e.g. FIG. 1) and a surface coating of the chip carrier 2 (see FIG. 9). For the sake of simplicity, not all technically meaningful combinations of the described exemplary embodiments are described in detail in this description.

EXAMPLES

In the following, semiconductor devices with galvanically isolated semiconductor chips are described using examples.

Example 1 is a semiconductor device comprising: a chip carrier; a first semiconductor chip arranged on the chip carrier, the first semiconductor chip being located in a first electrical potential domain when the semiconductor device is operated; a second semiconductor chip arranged on the chip carrier, the second semiconductor chip being located in a second electrical potential domain different from the first electrical potential domain when the semiconductor device is operated; and an electrically insulating structure arranged between the first semiconductor chip and the second semiconductor chip, which is designed to galvanically isolate the first semiconductor chip and the second semiconductor chip from each other.

Example 2 is a semiconductor device according to example 1, wherein the electrically insulating structure is free of alkaline-earth components.

Example 3 is a semiconductor device according to example 1 or 2, wherein the electrically insulating structure is free of plasticizers and solvents.

Example 4 is a semiconductor device according to one of the preceding examples, wherein: the first electrical potential domain corresponds to a first ground potential, the first semiconductor chip being connected to the first ground potential, and/or the second electrical potential domain corresponds to a second ground potential different from the first ground potential, the second semiconductor chip being connected to the second ground potential.

Example 5 is a semiconductor device according to one of the examples 1 to 3, wherein: the first electrical potential domain corresponds to a first operating voltage of the first semiconductor chip, and the second electrical potential domain corresponds to a second operating voltage of the second semiconductor chip, which is different from the first operating voltage.

Example 6 is a semiconductor device according to one of the preceding examples, also comprising: a chip fixing material located between the first semiconductor chip and the chip carrier.

Example 7 is a semiconductor device according to one of the preceding examples, wherein the electrically insulating structure comprises a dielectric.

Example 8 is a semiconductor device according to example 7, wherein the dielectric comprises at least one of the following materials: ceramic, glass, Kapton.

Example 9 is a semiconductor device according to one of the preceding examples, wherein the electrically insulating structure is implemented as a surface coating of the first semiconductor chip.

Example 10 is a semiconductor device according to example 9, wherein the surface coating of the first semiconductor chip comprises at least one of the following materials: silicon oxide, silicon nitride, metal oxide, polymer, polyimide.

Example 11 is a semiconductor device according to one of the preceding examples, wherein the electrically insulating structure is implemented as a surface coating of the chip carrier.

Example 12 is a semiconductor device according to example 11, wherein the surface coating of the chip carrier comprises at least one of the following materials: parylene, metal oxide.

Example 13 is a semiconductor device according to one of the preceding examples, wherein the electrically insulating structure is implemented as an encapsulation material, at least one of the first semiconductor chip or the second semiconductor chip being encapsulated by the encapsulation material.

Example 14 is a semiconductor device according to one of the preceding examples, wherein the electrically insulating structure is part of a routable molded lead frame.

Example 15 is a semiconductor device according to one of the preceding examples, wherein the electrically insulating structure is located between the first semiconductor chip and the chip carrier.

Example 16 is a semiconductor device according to example 15, further comprising: a further electrically insulating structure arranged between the second semiconductor chip and the chip carrier.

Example 17 is a semiconductor device according to one of the preceding examples, wherein: the first semiconductor chip and the second semiconductor chip are arranged on the same surface of the chip carrier, and the first semiconductor chip and the second semiconductor chip are stacked on top of each other.

Example 18 is a semiconductor device according to one of the preceding examples, wherein the first semiconductor chip and the second semiconductor chip each comprise a sensor chip.

Example 19 is a semiconductor device according to one of the examples 1 to 17, wherein the first semiconductor chip and the second semiconductor chip form a coupler.

Example 20 is a semiconductor device according to one of the examples 1 to 17, wherein: the first semiconductor chip comprises a power semiconductor chip and the second semiconductor chip comprises a logic semiconductor chip.

Although specific embodiments have been shown and described herein, it is obvious to the person of average skill in the art that a plurality of alternative and/or equivalent implementations can replace the specific embodiments shown and described, without departing from the scope of the present disclosure. This application is intended to include all modifications or variations of the specific embodiments discussed herein. It is therefore intended that this disclosure is limited only by the claims and their equivalents.

What is claimed is:

1. A semiconductor device, comprising:
    a chip carrier;
    a first semiconductor chip arranged on the chip carrier, the first semiconductor chip being located in a first electrical potential domain during operation of the semiconductor device;
    an electrically insulating structure arranged on the first semiconductor chip;
    a second semiconductor chip arranged on the electrically insulating structure, the second semiconductor chip is entirely galvanically isolated from the first semiconductor chip and is located in a second electrical potential domain different from the first electrical potential domain when the semiconductor device is operated; and
    a connecting lead electrically coupled to the second semiconductor chip to provide a second electrical potential to the second semiconductor chip, wherein the connecting lead is spatially separated from the chip carrier by a gap, wherein the gap galvanically isolates the connecting lead from the chip carrier,
    wherein the electrically insulating structure is arranged between the first semiconductor chip and the second semiconductor chip and is configured to galvanically isolate the first semiconductor chip and the second semiconductor chip from each other,
    wherein the first electrical potential domain corresponds to a first operating voltage of the first semiconductor chip, and
    wherein the second electrical potential domain corresponds to a second operating voltage of the second semiconductor chip, which is different from the first operating voltage.

2. The semiconductor device as claimed in claim 1, wherein the chip carrier is located at a carrier electrical potential during operation of the semiconductor device.

3. The semiconductor device as claimed in claim 2, wherein carrier electrical potential is the same as the first electrical potential domain.

4. The semiconductor device as claimed in claim 2, wherein the carrier electrical potential is different from the first operating voltage and the second operating voltage.

5. The semiconductor device as claimed in claim 1, wherein the electrically insulating structure is implemented as a surface coating.

6. The semiconductor device as claimed in claim 1, further comprising:
    an encapsulation material that encapsulates the first semiconductor chip, the second semiconductor chip, the electrically insulating structure, at least a portion of the chip carrier, and a portion of the connecting lead.

7. The semiconductor device as claimed in claim 6, wherein the encapsulation material has a one-piece integral construction, and the encapsulation material extends through the gap between the connecting lead and the chip carrier.

8. The semiconductor device as claimed in claim 1, wherein the electrically insulating structure is implemented as an encapsulation material, wherein at least one of the first semiconductor chip or the second semiconductor chip is encapsulated by the encapsulation material.

9. A semiconductor device, comprising:
    a chip carrier comprising a first surface and a second surface arranged opposite to the first surface, wherein the chip carrier is located at a carrier electrical potential during operation of the semiconductor device;
    a first semiconductor chip arranged on the first surface of the chip carrier, the first semiconductor chip being located in a first electrical potential domain during operation of the semiconductor device;
    a first electrically insulating structure arranged on the first surface of the chip carrier and interposed between the chip carrier and the first semiconductor chip to galvanically isolated the first semiconductor chip from the chip carrier;
    a second semiconductor chip arranged on the second surface of the chip carrier, the second semiconductor chip being located in the first electrical potential domain during operation of the semiconductor device;
    a second electrically insulating structure arranged on the second surface of the chip carrier and interposed between the chip carrier and the second semiconductor chip to galvanically isolated the second semiconductor chip from the chip carrier; and
    a connecting lead electrically coupled to the first and the second semiconductor chips to provide a first electrical potential to the first and the second semiconductor chips, wherein the connecting lead is spatially separated from the chip carrier by a gap, wherein the gap galvanically isolates the connecting lead from the chip carrier,
    wherein the first electrical potential domain corresponds to a first operating voltage of the first semiconductor chip, and
    wherein the carrier electrical potential is different from the first operating voltage.

10. The semiconductor device as claimed in claim 9, wherein the carrier electrical potential corresponds to a second operating voltage of the semiconductor device that is different from the first operating voltage.

11. The semiconductor device as claimed in claim 9, wherein the carrier electrical potential corresponds to floating electrical potential of the semiconductor device.

12. The semiconductor device as claimed in claim 9, wherein the first and the second electrically insulating structures are implemented as surface coatings.

13. The semiconductor device as claimed in claim 9, further comprising:
    an encapsulation material that encapsulates the first semiconductor chip, the second semiconductor chip, the first electrically insulating structure, the second electrically insulating structure, at least a portion of the chip carrier, and a portion of the connecting lead.

14. The semiconductor device as claimed in claim 13, wherein the encapsulation material has a one-piece integral construction and extends through the gap between the connecting lead and the chip carrier.

15. The semiconductor device as claimed in claim 9, wherein the first electrically insulating structure is implemented as an encapsulation material that encapsulates the first semiconductor chip and the second electrically insulating structure is implemented as an encapsulation material that encapsulates the second semiconductor chip.

16. A semiconductor device, comprising:
- a first connecting lead configured to provide a first electrical potential;
- a first semiconductor chip arranged on the first connecting lead, the first semiconductor chip being electrically coupled to the first connecting lead such that the first semiconductor chip is located in a first electrical potential domain comprising the first electrical potential during operation of the semiconductor device, wherein the first semiconductor chip and the first connecting lead form a first stacked structure;
- a second connecting lead configured to provide a second electrical potential;
- a second semiconductor chip arranged on the second connecting lead, the second semiconductor chip being electrically coupled to the second connecting lead such that the second semiconductor chip is located in a second electrical potential domain comprising the second electrical potential, the second electrical potential domain being different from the first electrical potential domain when the semiconductor device is operated, wherein the second semiconductor chip and the second connecting lead form a second stacked structure; and
- a gap that spatially separates the first stacked structure from the second stacked structure to galvanically isolate the first stacked structure from the second stacked structure.

17. The semiconductor device as claimed in claim 16, wherein:
the first electrical potential corresponds to a first operating voltage of the first semiconductor chip, and
the second electrical potential corresponds to a second operating voltage of the second semiconductor chip, which is different from the first operating voltage.

18. The semiconductor device as claimed in claim 16, further comprising:
an encapsulation material that encapsulates the first semiconductor chip, the second semiconductor chip, a portion of the first connecting lead, and a portion of the second connecting lead.

19. The semiconductor device as claimed in claim 18, wherein the encapsulation material has a one-piece integral construction and extends through the gap between the first stacked structure and the second stacked structure.

20. A semiconductor device, comprising:
a chip carrier comprising a first surface, a second surface arranged opposite to the first surface, a first connecting lead arranged at a first lateral end of the chip carrier, a second connecting lead arranged at a second lateral end of the chip carrier arranged opposite to the first lateral end, and at least one electrically insulating region that is laterally arranged between the first connecting lead and the second connecting lead to provide electrical isolation therebetween,
wherein the first connecting lead is configured to provide a first electrical potential and the second connecting lead is configured to provide a second electrical potential different from the first electrical potential;
a first semiconductor chip arranged on the first surface of the chip carrier and electrically coupled to the first connecting lead, wherein the first semiconductor chip being located in a first electrical potential domain comprising the first electrical potential during operation of the semiconductor device; and
a second semiconductor chip arranged on the second surface of the chip carrier and electrically coupled to the second connecting lead, wherein the second semiconductor chip being located in a second electrical potential domain comprising the second electrical potential during operation of the semiconductor device.

21. The semiconductor device as claimed in claim 20, wherein:
the at least one electrically insulating region includes a central insulating region that laterally extends from the first connecting lead to the second connecting lead, and
the first semiconductor chip and the second semiconductor chip are mechanically coupled to the central insulating region.

22. The semiconductor device as claimed in claim 21, wherein the chip carrier is a routable molded lead frame.

23. The semiconductor device as claimed in claim 20, wherein:
the at least one electrically insulating region includes a first insulating region coupled to the first connecting lead, a second insulating region coupled to the second connecting lead, a central region that laterally extends between the first insulating region and the second insulating region, and
the first semiconductor chip and the second semiconductor chip are mechanically coupled to the central region.

24. The semiconductor device as claimed in claim 23, wherein the first insulating region galvanically isolates the first connecting lead from the central region, and the second insulating region galvanically isolates the second connecting lead from the central region.

25. The semiconductor device as claimed in claim 24, wherein:
at the first surface, the central region comprises a recess filled with an electrically insulating material,
the first semiconductor chip is mechanically coupled to the electrically insulating material, and
the electrically insulating material is configured to galvanically isolate the first semiconductor chip from the second semiconductor chip.

26. The semiconductor device as claimed in claim 25, wherein:
the central region comprises an electrically conductive material, and
the second semiconductor chip is mechanically coupled to the electrically conductive material.

27. The semiconductor device as claimed in claim 20, wherein:
the first electrical potential domain corresponds to a first operating voltage of the first semiconductor chip, and
the second electrical potential domain corresponds to a second operating voltage of the second semiconductor chip, which is different from the first operating voltage.

* * * * *